United States Patent [19]

Komatsu

[11] Patent Number: 4,628,343
[45] Date of Patent: Dec. 9, 1986

[54] SEMICONDUCTOR INTEGRATED CIRCUIT DEVICE FREE FROM MUTUAL INTERFERENCE BETWEEN CIRCUIT BLOCKS FORMED THEREIN

[75] Inventor: Yuji Komatsu, Tokyo, Japan
[73] Assignee: NEC Corporation, Tokyo, Japan
[21] Appl. No.: 846,822
[22] Filed: Mar. 31, 1986

Related U.S. Application Data

[63] Continuation of Ser. No. 549,604, Nov. 7, 1983.

[30] Foreign Application Priority Data

Nov. 8, 1982 [JP] Japan .................... 57-195480

[51] Int. Cl.[4] ................. H01L 23/50; H01L 27/06
[52] U.S. Cl. ........................... 357/84; 357/68; 357/48; 357/40
[58] Field of Search ............... 357/68, 84, 48, 40, 357/45

[56] References Cited

U.S. PATENT DOCUMENTS 3,754,170  8/1973  Tsuda et al. .................. 357/84
4,499,484  2/1985  Tanizawa et al. ............. 357/45
4,511,914  4/1985  Remedi et al. ................ 357/45

FOREIGN PATENT DOCUMENTS 1903342  9/1969  Fed. Rep. of Germany ........ 357/84
56-27962  3/1981  Japan ........................ 357/84

*Primary Examiner*—William D. Larkins
*Assistant Examiner*—John Lamont
*Attorney, Agent, or Firm*—Burns, Doane, Swecker & Mathis

[57] ABSTRACT

A semiconductor integrated circuit device comprises a first circuit block for processing a first signal, a second circuit block for processing a second signal different in frequency and/or signal level from the first signal, a conductor layer representing a substantially zero a.c. impedance and formed on a portion of a semiconductor chip between the first and second circuit blocks, and an isolation region formed in the portion of the semiconductor chip, the conductor layer and the isolation region being connected to each other through at least one contact hole provided between the first and second circuit blocks to prevent the mutual interference between the first and second circuit blocks.

7 Claims, 4 Drawing Figures

SEMICONDUCTOR INTEGRATED CIRCUIT DEVICE FREE FROM MUTUAL INTERFERENCE BETWEEN CIRCUIT BLOCKS FORMED THEREIN

This application is a continuation of application Ser. No. 549,604, filed Nov. 7, 1983.

BACKGROUND OF THE INVENTION

The present invention relates to the structure of a semiconductor integrated circuit, and more particularly to a semiconductor integrated circuit device wherein a plurality of circuit blocks each processing signals different in frequency and/or level from one another are formed on the same semiconductor chip.

Because of technological advance in semiconductor integrated circuits, the number of active and passive elements formed in one semiconductor chip has increased. This has enabled the realization of integrated circuit devices performing a plurality of functions. In a television receiver, for instance, it has been possible to realize in one integrated circuit device two functions: one is a video signal processing function which includes circuit blocks of a video IF (intermediate frequency) amplifier, a video detector and an automatic gain control of the video IF amplifier and a tuner, and the other is a sound signal processing function which includes circuit blocks of a sound IF separator, a sound IF amplifier, a sound signal detector and a sound signal amplifier. In the prior art, these video signal processing function and sound signal processing function were formed usually in separate integrated circuit devices.

However, there still remains a problem of mutual interference between circuit blocks. If these blocks are simply formed on one semiconductor chip, because the video signal processing function processes the video IF signal of a high-frequency (about 60 MHz) and generates a picture signal of 6 MHz band therefrom and the sound signal processing function processes the sound IF signal of 4.5 MHz and demodulates it to produce the sound signal in an audio-frequency band, the signals processed in the respective circuit blocks are different in frequency and level from one another. For this reason, interference of signals may occur between the circuit blocks. One reason for the interference is based on the fact that a common impedance caused by a part common use of a voltage source wiring or a ground wiring is commonly used for several circuit blocks. Interference may also occur due to stray capacities between wirings, or through the inside of a semiconductor chip. This interference of signals results in a crosstalk, or in the generation of noise or distortion in output signals.

The interference of signals due to the common impedance or the stray capacities can be suppressed in some degree by appropriate design of the wirings or the arrangement of the circuit blocks. However, the interference of signals through the inside of the semiconductor chip could not be suppressed sufficiently.

SUMMARY OF THE INVENTION

An object of the present invention is to provide an improved semiconductor integrated circuit device wherein a plurality of circuit blocks each processing signals different in frequency and/or level from one another are formed in the same semiconductor chip.

A further object of the present invention is to provide a semiconductor integrated circuit device wherein interference of signals among a plurality of circuit blocks is suppressed.

Another object of the present invention is to provide a semiconductor integrated circuit device wherein interference of signals is suppressed, in particular, through the semiconductor chip itself.

According to the present invention, there is provided a semiconductor integrated circuit device formed on one semiconductor chip in which a first circuit block or blocks and a second circuit block or blocks, which process a first signal and a second signal, respectively, the first and second signals being different in signal frequency and/or signal level from each other, are fabricated and a conductor layer showing substantially zero a.c. impedance is provided on a part of the semiconductor chip between the first and second circuit blocks. The conductor layer is preferably grounded with substantial zero impedance for an a.c. current. Moreover, an isolation region is formed in a part of the semiconductor chip between the first and second circuit blocks. This isolation region is directly connected to the conductor layer through at least one contact hole provided in a surface passivation film at a portion on the isolation region.

Since the conductor layer provided between the first and second circuit blocks has substantial zero a.c. impedance, the first and second circuit blocks are shielded electrically from each other on the surface of the semiconductor chip. Accordingly, the first and second circuit blocks are free from interference of signals caused by a stray capacity which is formed between wiring in the first circuit block and wiring in the second circuit block. The isolation region is formed in the part of the semiconductor chip between the first and second circuit blocks. Therefore, a signal component which leaks between the first and second circuit blocks through the inside of the semiconductor chip flows to ground potential through the isolation region. This isolation region is connected to the conductor layer through the contact hole of a surface passivation layer provided between the first and second circuit blocks. Consequently, the signal component flowing into the isolation region is absorbed immediately by the conductor layer and is led to an alternating-current ground point through this conductor layer having low impedance. This means that the signal component is not led to the alternating-current ground point through the isolation region or a semiconductor substrate which has relatively high impedance. In other words, the interference caused by so-called "wiring resistance" is prevented. Thus, the first and second circuit blocks are also shielded electrically in the semiconductor chip. As a result, the mutual interference between these blocks through the semiconductor chip is also prevented.

It is important to connect the isolation region and the conductor layer at a portion between the first and second circuit blocks. If they are connected outside this portion, a resistance component in the isolation region hinders the signal component flowing into this region from being absorbed rapidly by the conductor layer. Consequently, the signal component is transmitted to the first or second circuit block, and thus a sufficient prevention of the mutual interference can not be obtained. By connecting the conductor layer to the isolation region at the portion between the first and second circuit blocks, the suppression of the mutual interference is attained to a great extent.

It is desirable that the conductor layer is directly connected to the isolation region in the whole area between the first and second circuit blocks. However, the transmission of signals between the first and second circuit blocks through wirings formed on the semiconductor chip is unavoidable. Therefore, the direct connection of the conductor layer and the isolation region may partially surround these blocks. The wiring between circuit blocks may be disposed between the isolation region and the conductor layer at a portion where the conductor layer is disposed on the isolation region without contact thereto. It is convenient that the conductor layer is formed of a power supply wiring or a ground wiring, either of which has a.c. impedance of substantially zero.

BRIEF DESCRIPTION OF THE DRAWINGS

The above and other objects, advantages and features of the present invention will be made more apparent by the following description taken in conjunction with the attached drawings, wherein.

DETAILED DESCRIPTION OF THE PREFERRED EMBODIMENT

Figure 1:
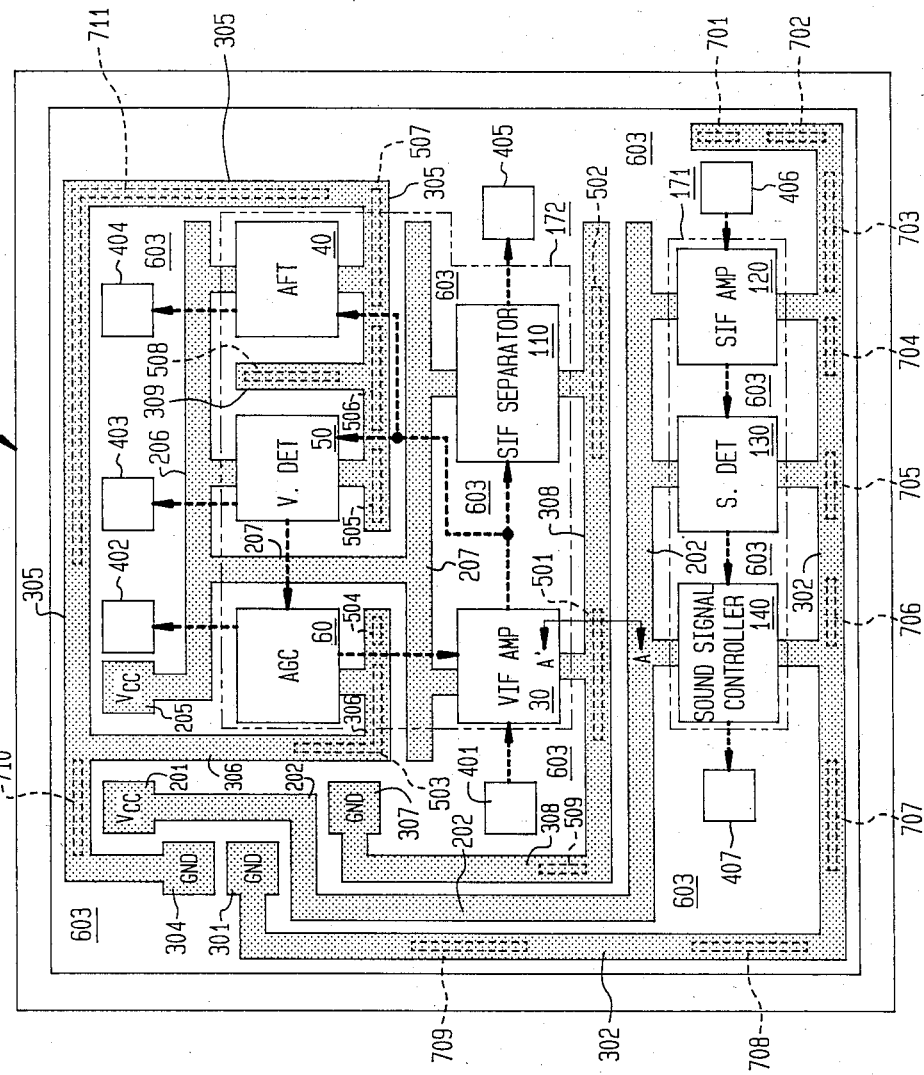
FIG. 1 is a plan view of a semiconductor integrated circuit chip according to a preferred embodiment of the present invention.

FIG. 1 is a plan view of a semiconductor integrated circuit chip according to a preferred embodiment of the present invention. A large number of active and passive elements are formed on a semiconductor chip and are interconnected by wirings in accordance with a circuit diagram. FIG. 1 does not show the details of these elements and wirings, but shows the arrangement of a plurality of circuit blocks formed on a semiconductor chip and wiring pattern to avoid the complexity of the drawing and facilitate the understanding of the invention. A chip 170 has two functions for processing video and sound signals in a color-television receiver. Prior to a detailed description of the IC chip 170, a description will be made on the color-television receiver with reference to FIG. 2.

Figure 2:
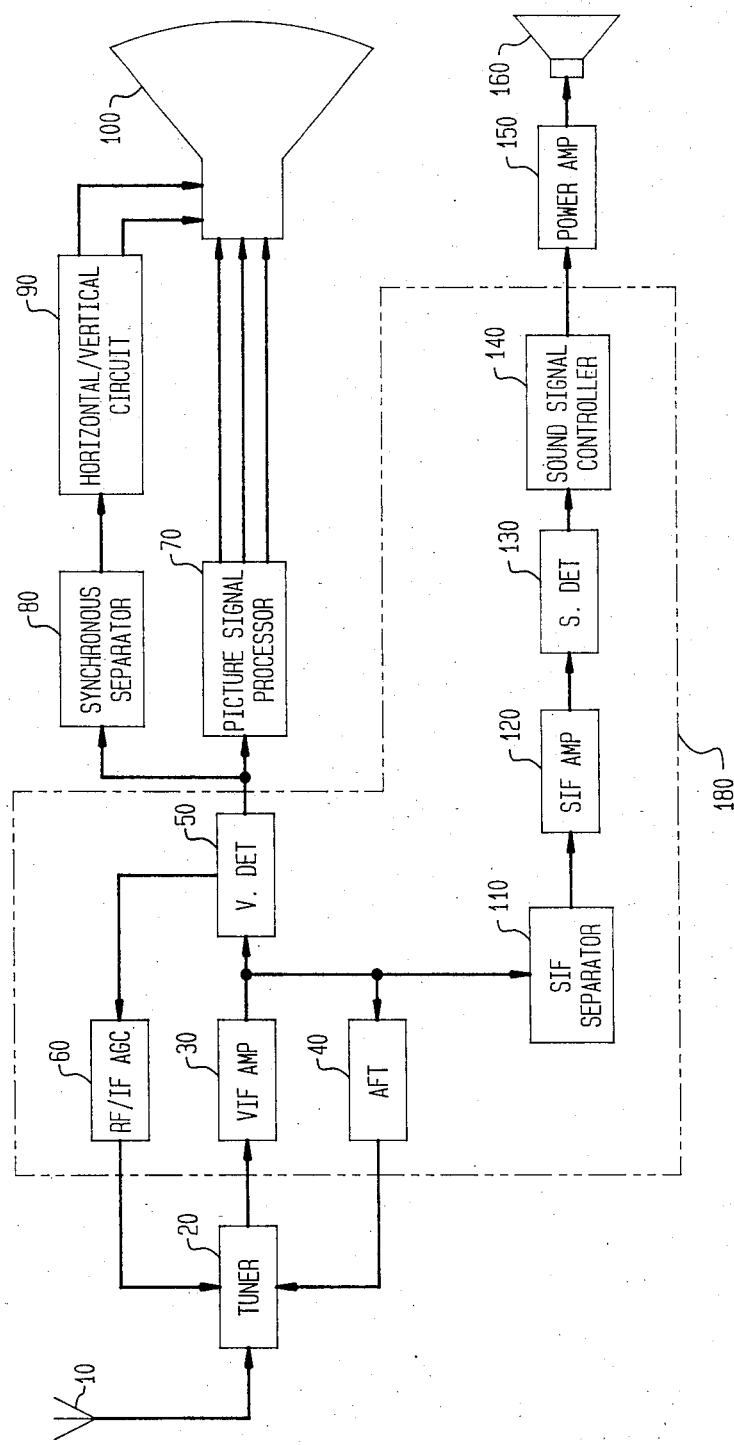
FIG. 2 is a block diagram showing a color-television receiver.

FIG. 2 is a block diagram of a color-television receiver. A desired broadcast wave is received by a tuner 20 through an antenna 10. The tuner 20 comprises an amplifier section and a frequency mixer section (both not shown in the figure) and produces a video IF (intermediate frequency) signal of a frequency of about 60 MHz. This video IF signal is amplified by a video IF amplifier (VIF AMP) 30, and an amplified output therefrom is supplied to a video signal detector (V. DET) 50. The video IF signal is further supplied to an AFT (automatic fine tuning) circuit 40. The AFT circuit 40 generates an AFT signal to control the tuner 20, so that optimum tuning can be attained. The video signal detector 50 generates a picture signal in a 6-MHz band and supplies it to an AGC (automztic gain control) circuit 60. The AGC circuit 60 generates an AGC signal (DC voltage) according to the level of the picture signal to control the gain of the intermediate frequency amplifier 30 and the amplifier section of the tuner 20. The picture signal from the detector 50 is supplied to a picture signal processor 70 and further to a synchronous separator 80. The picture signal processor circuit 70 supplies to a CRT (cathode-ray tube) 100 three primary-color signals R, G and B or three color-difference signals R-Y, G-Y and B-Y which are necessary for regenerating a color picture image. The synchronous separator 80 separates horizontal and vertical synchronizing signals from the picture signal and supplies them to a horizontal/vertical deflection circuit 90. This circuit 90 supplies horizontal and vertical deflection signals to the CRT 100 in response to input signals. Thereby, the color picture image is reproduced in a screen of the CRT 100.

The output signal of the video intermediate frequency amplifier 30 is further supplied to a sound IF (intermediate frequency) signal separator 110. This separator 110 separates a sound IF signal of 4.5-MHz from the video IF signal. The sound IF signal is amplified by a sound IF amplifier (SIF AMP) 120. An amplified output is supplied to a sound detector (S. DET) 130, whereby a sound signal in an audio-frequency band is obtained therefrom. A sound signal controller 140 comprises an electric volume circuit section and a preamplifier section and controls the level of the sound signal in accordance with the operation of a volume knob (not shown but attached to the TV set cabinet). A power amplifier 150 amplifies the sound signal to drive a speaker 160, and thereby a television sound is generated.

In FIG. 2, the circuit blocks 30 to 60 and 110 to 140, which are enclosed by a dotted line 180, are fabricated on one semiconductor chip and furnished as one chip IC 170 shown in FIG. 1.

Figure 3:
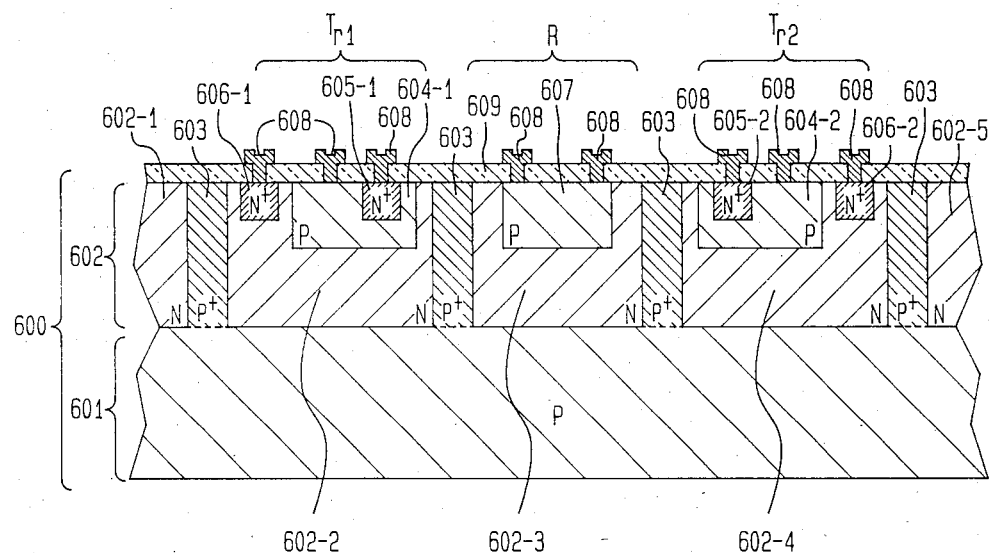
FIG. 3 is a cross-sectional view showing a structure of a bipolar integrated circuit.

Each of circuit blocks in the dotted line 180 of FIG. 2 is formed in one semiconductor chip in the following way. Each circuit block comprises a great number of active and passive elements such as transistors, diodes, resistors, etc., which are interconnected in accordance with the circuit diagram. Accordingly, the active and passive elements required for the respective circuit blocks are formed in a semiconductor body 600, as shown in FIG. 3. Since bipolar transistors are usually used for processing video IF and sound IF signals, the semiconductor body 600 is composed of a semiconductor substrate (silicon substrate) 601 of one conductivity type (for exampy, P-type) and an epitaxial layer 602 of the other conductivity type (N-type) which is formed on the substrate 601. The epitaxial layer 602 is separated into a large number of island regions (five island regions 602-1 to 602-5 being shown in FIG. 3) by an isolation region 603 of the one conductivity type (P type) which has a mesh-like figure in plan view and reaches the substrate 601. Active elements such as transistors and diodes are formed generally in one island region. Two or more resistors can be formed in one island region. FIG. 3 shows two transistors $Tr_1$ and $Tr_2$ and one resistor R. The transistor $Tr_1$ has one island region 602-2 as a collector region, wherein a base region 604-1 and an emitter region 605-1 are formed. The transistor $Tr_2$ has also a base region 604-2 and an emitter region 605-2 formed in other island region 602-4 serving as the collector region thereof. Regions 606-1 and 606-2 serve as collector contact regions of the transistors $Tr_1$ and $Tr_2$, respectively. The resistor $R_1$ is formed of a P-type region 607 formed in other island region 602-3. Thus, regions for the elements of transistors, diodes, resistors, etc. are formed in a number of island regions, respectively. The elements formed in the semiconductor body 600 are interconnected according to the circuit diagram. For this purpose, contact holes for the respective regions are formed in an insulating film 609 formed on the surface of the main body 600, and the elements are interconnected by conductor layers 608 which are connected to the respective regions through the contact holes.

A great number of active and passive elements formed in one semiconductor body in this way are connected in accordance with the circuit diagram, so as to provide an IC chip 170 of FIG. 1 which has a video signal processing section 172 consisting of the circuit blocks 30, 40, 50, 60 and 110 and a sound signal processing section 171 consisting of the circuit blocks 120, 130 and 140. A number of active and passive elements constituting the respective circuit blocks are separated by the isolation region 603, and the respective circuit blocks 30 to 60 and 110 to 120 are also separated by the isolation region 603.

The video signal processing section 172 deals with an amplitude-modulation signal, while the sound signal processing section 171 processes a frequency-modulation signal and audio signal which are different in frequency and level from those of the video signal. Therefore, it is necessary to prevent the mutual interference of signals between these two signal processing sections 171 and 172. Moreover, the video IF signal amplifier 30 amplifies the signal of a high-frequency (60 MHz). Therefore, it becomes also necessary to prevent the mutual interference of signals occuring between the video IF signal amplifier 30 and another circuit block in the video signal processing section 172.

In order to meet these requirements, measures for preventing the signal interference are applied to the IC chip 170 shown in FIG. 1. The detailed description about the measures will now be made hereinafter.

In order that the IC chip fulfills prescribed functions, a power supply voltage, a ground potential as a reference potential and input signals should be supplied to the chip. For this purpose, the IC chip is provided with an electrode pad to which the power supply voltage is applied. The IC chip 170 shown in FIG. 1 is provided with two power source (Vcc) electrode pads 201 and 205. The electrode pads 201 and 205 are connected to one external lead terminal (not shown in the figure) via bonding wires (not shown in the figure), and the power supply voltage is applied to these pads 201 and 205 therethrough. The power supply voltage applied to the electrode pad 201 is supplied to each of the circuit blocks 120, 130 and 140 in the sound signal processing section 171 via a wiring conductor 202 (formed by a metal) extending from the pad 201. The circuit blocks 30, 40, 50, 60 and 110 in the video signal processing section 172 are supplied with the power supply voltage through the electrode pad 205 and wiring conductors 206 and 207 (formed by a metal) connected thereto. Thus, the power supply voltage is supplied to the two signal processing sections 171 and 172 through separate wirings, respectively. In other words, there is no common portion between the power supply wirings of two signal processing systems 171 and 172. Consequently, the signal interference between the two signal processing sections 171 and 172 caused by the common impedance of power supply wiring is prevented.

It is preferable that a ground wiring is also provided separately for each of the two signal processing sections 171 and 172. Three ground (GND) electrode pads 301, 304 and 307 are provided for this purpose. The first ground electrode pad 301 is connected to each of circuit blocks 120, 130 and 140 in the sound signal processing section 171 via a ground wiring 302. The second ground electrode pad 304 is connected to the AFT circuit 40, the picture signal detector 50 and the AGC circuit 60 in the video signal processing section 172 via wirings 305 and 306. The video IF signal amplifier 30 and the sound IF signal separator circuit 110 are connected not to the second ground electrode pad 304, but to the third ground electrode pad 307 via a wiring 308. Thus, the ground wiring of the sound signal processing section 171 and that of the video signal processing section 172 are formed separately from each other, and there is no common portion of the ground wiring between two sections 171 and 172. Therefore, the signal interference between the two signal processing sections 171 and 172 caused by the ground common impedance is prevented.

As is apparent from FIG. 1, the wiring 202 connected to the source electrode pad 201 is interposed in long extension between the sound IF signal processing section 171 and the video signal processing system 172. The wiring 308 extending from the ground electrode pad 307 also lies between the two signal processing sections 171 and 172 with a long extension. The wirings 202 and 308 are supplied with the power supply voltage and the ground potential, respectively, and their AC impedances are substantially zero. In other words, the sound signal processing system 171 and the video signal processing signal 172 are shielded electrically on the surface of the chip 170. Consequently, the mutual interference of signals caused by stray capacitances between the two signal processing sections 171 and 172 is prevented.

The wiring 207 extending from the source electrode pad 205 is interposed between the AGC circuit 60 and the video signal detector 50. The wiring 207 further lies between a circuit section composed of the AGC circuit 60, the video signal detector 50 and the AFT circuit 40, and a circuit section composed of the video IF amplifier 30 and the sound IF separator circuit 110. Moreover, the wiring 306 extending from the ground electrode pad 304 is interposed between the AGC circuit 60 and the video IF signal amplifier 30. The ground wiring 305 is interposed between the sound IF signal separator 110 and the video signal detector 50, and further interposed between the separator 110 and the AFT circuit 40. A ground wiring 309 extending from the wiring 305 is provided between the video signal detector 50 and the AFT circuit 40. By these wiring arrangements, signal interference which may occur in the video signal processing section 172 is prevented, since the electrical shields are made between the circuit blocks 30 and 60, between the blocks 30 and 50, and between the blocks 30 and 40, respectively.

As described above, the chip 170 of FIG. 1 prevents mutual interference of signals which may occur between the sound signal processing section 171 and the video signal processing section 172 due to the common impedance of the source or the ground wirings or the stray capacitances. Further, signal interference in the video signal processing section 172 is also prevented. Such interference may be caused, for example, by the fact that the video IF signal amplifier 30 amplifies the high-frequency signal.

It is noted that the respective power supply and ground wirings are isolated from the conductor layers 608 shown in FIG. 3 for interconnections and from input/output wirings shown by dotted lines in FIG. 1 for transmitting signals between the circuit blocks. The input/output wirings of the dotted line cross the power supply or grounding wirings by a multilayer wiring structure.

The above-stated designs are for removing the factors of the mutual interference on the surface of the semiconductor chip in which many circuit blocks are formed. Therefore, those designs are not effective in preventing mutual interference of signals occurring through the inside of the semiconductor chip.

In order to prevent interference of signals through the inside of the semiconductor chip, the isolation region 603, which is explained with reference to FIG. 3, is formed between the two signal processing sections 171 and 172. Further, the isolation region 603 and the ground wiring 308 are connected to each other through contact holes 501 and 502 of the insulating film 609 which is provided between the two signal processing sections 171 and 172, as shown in FIG. 4 which is a cross-sectional view of FIG. 1 along a line A—A'.

As described with reference to FIG. 3, a great number of active and passive elements formed on the semiconductor body 600 are separated from one another by the isolation region 603 and are isolated electrically from one another by giving the ground potential to the region 603. However, the leakage of signals may occur between circuit blocks owing to the resistance component of the isolation region 603, unless the connection of the isolation region 603 and the ground wirings is obtained between the circuit blocks. Moreover, a change in potential at the substrate 601 caused by the resistance component of the isolation region affects other circuit blocks. These phenomena cause the mutual interference of signals through the semiconductor chip itself. The above phenomena are remarkable, in particular, in the case that two quite different signals such as the video or video IF signal and the sound IF signal are processed in one chip.

Figure 4:
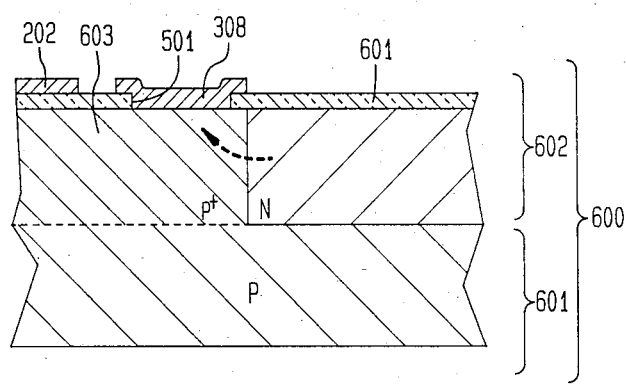
FIG. 4 is a cross-sectional view taken along a line A—A' of FIG. 1.

As shown in FIGS. 1 and 4, the IC chip 170 according to the present invention has the ground wiring 308 provided along the isolation region 603 which is formed between the video signal processing section 172 and the sound signal processing section 171. Moreover, the isolation region 603 and the ground wiring 308 are directly connected to each other through the contact holes 501 and 502 provided between the two signal processing sections 171 and 172. Accordingly, a signal component (shown by a dotted line in FIG. 4) which leaks from the video signal processing section 172 to the isolation region 603 is absorbed immediately by the ground wiring 308 before it is transmitted to the sound signal processing section 171. This is because the contact holes 501 and 502 are formed between the two signal processing sections 171 and 172.

Likewise, the ground wiring 306 interposed between the AGC circuit 60 and the video IF signal amplifier 30 is connected to the isolation region 603 through contact holes 503 and 504 formed between the circuit blocks 60 and 30. Further, the ground wiring 305 is also connected to the isolation region 603 through contact holes 505, 506 and 507 provided between the circuit blocks 30 and 110 and the circuit blocks 40 and 50. Furthermore, the ground wiring 309 connected to the isolation region 603 through a contact hole 508 is interposed between the video signal detector 50 and the AFT circuit 40. Accordingly, the arrangement of the isolation region 603 and ground wiring 305 and 306 prevents mutual interference of signals through the semiconductor chip itself, which occurs between circuit blocks in the video signal processing section 172. It should be noted that the contact holes 501 to 508 are made in the insulating film 609 (FIGS. 3 and 4) formed on the semiconductor body 600 to protect it.

It is desirable that the contact holes 501 and 502, 503 and 504, and 505 to 508, are formed in continuity, respectively. However, in addition to the wiring (608 in FIG. 3) for connecting active and passive elements and the ground and power supply wirings, the chip 170 provides wiring for transmitting signals between circuit blocks as shown by dotted lines in FIG. 1. Therefore, the contact holes 501 to 508 may be formed separately in several places between blocks, and the isolation region 603 is connected to the respective ground wiring 302, 305, 306, 308 and 309 through these holes, as shown in FIG. 1.

While the ground wiring is connected to the isolation region 603 in the above embodiment, the power source wirings 202 and 207 are connected through contact holes provided between the circuit blocks to the isolation region 603 where the isolation region is of N-type or designed to be supplied with the power supply voltage. The present invention is also applicable to an integrated circuit device constituted by insulated-gate type transistors. In the integrated circuit of this kind, the isolation region for separating elements from one another is usually not formed, unlike the bipolar IC. Accordingly, a high impurity region is formed in a semiconductor substrate as the isolation region between circuit blocks constituted by a great number of insulated-gate type transistors, respectively. It is preferable that this impurity region may be either the same conductivity type as or the different conductivity type from the semiconductor substrate and has an impurity concentration higher than the substrate. A conductor layer presenting substantially zero a.c. impedance is formed along the impurity region. In other words, the conductor layer is formed in extension between circuit blocks. The impurity region and the conductor layer are connected through a contact hole or contact holes provided between the circuit blocks in accordance with FIG. 1. As a result, the mutual interference of signals between the circuit blocks through the semiconductor substrate itself is also prevented in the integrated circuit device which is constituted by the insulated-gate type transistors. It is convenient to employ either a power source wiring or a ground wiring as the conductor layer, and either one of these wirings is connected to the isolation region in accordance with the conductivity type of the impurity region.

As described in detail hereinbefore, the mutual interference between the circuit blocks caused by the semiconductor chip itself can be prevented by providing the conductor layer of substantial zero a.c. impedance and the isolation region between the circuit blocks and by connecting them to each other through the contact hole provided between the circuit blocks.

In addition to the power source electrode pads 201 and 205 and the ground electrode pads 301, 304 and 307, the chip 170 shown in FIG. 1 has pads for input/output signals and pads for connecting external elements such as capacitive elements or inductive elements which are difficult to be fabricated within the chip 170. FIG. 1 illustrates an input pad 401 for the video IF signal, an output pad 402 for the AGC signal, an output pad 403 for the picture signal, an output pad 404 for the AFT signal, output and input pads 405 and 406 for the sound IF signal and an output pad 407 for the sound signal.

In order to ensure preventing the change in voltage of the substrate 601 (FIG. 3), the isolation region 603 is formed under the ground wirings 302 and 305 provided along the periphery of the chip 170, and is connected to the wirings 302 and 305 through contact holes 701 to 711, as shown in FIG. 1.

The integrated circuit device according to the present invention decreases cross-talk sufficiently and generates output signals with a low noise and a low distortion, since mutual interference of signals which may occur through the surface and inside of a semiconductor chip is suppressed, as described above in detail.

The present invention is not limited to the above embodiment, but can be modified without departing from the scope and spirit of the present invention. The number of the ground and source pads, for instance, may be one, or may be further increased. The present invention can also be applicable to mutual interference in the sound signal processing section 171. It is also applicable to the semiconductor integrated devices other than a television receiver, for instance, a modulation/demodulation circuit for communication.

What is claimed is:

1. A semiconductor device comprising a semiconductor body, an isolation region formed in said semiconductor body and partitioning said semiconductor body into at least two surface areas, a plurality of first circuit elements formed in one of said at least two surface areas to define a first circuit block which processes a first signal of a first frequency, a plurality of second circuit elements formed in another of said at least two surface areas to constitute a second circuit block which processes a second signal of a second frequency different from said first frequency, a first wiring layer formed on said semiconductor body for supplying a first operating voltage to said first circuit block, a second wiring layer formed on said semiconductor body separately from said first wiring layer and supplying a second operating voltage to said first circuit block, said second wiring layer having a portion extended along said isolation region between said one surface area and said another surface area, said extended portion of said second wiring layer being connected to said isolation region between said one surface area and said another surface area, a third wiring layer formed on said semiconductor body separately from said first and second wiring layers and supplying said first operating voltage to said second circuit block independently of said first wiring layer, said third wiring layer having a portion extended along said isolation region between said one surface area and said another surface area in parallel to said extended portion of said second wiring layer, said extended portions of said second and third wiring layers preventing a signal crosstalk between said first and second circuit blocks, and a fourth wiring layer formed on said semiconductor body separately from said first, second and third wiring layers and supplying said second operating voltage to said second circuit block independently of said second wiring layer.

2. The semiconductor device as claimed in claim 1, further comprising a first electrode pad supplied with said first operating voltage, a second electrode pad supplied with said second operating voltage, a third electrode pad supplied with said first operating voltage, and a fourth electrode pad supplied with said second operating voltage, said first, second, third and fourth electrode pads being formed on said semiconductor body separately from one another, and said first, second, third and fourth wiring layers being connected to said first, second, third and fourth electrode pads, respectively.

3. A semiconductor device comprising a semiconductor chip having first and second surface portions, said first surface portion including first and second sides disposed oppositely to each other and third and fourth sides disposed oppositely to each other and intersecting said first and second sides, said second surface portion including fifth and sixth sides disposed oppositely to each other and seventh and eighth sides disposed oppositely to each other and intersecting said fifth and sixth sides, said first and second surface portions being disposed such that said second side of said first surface portion is adjacent to said fifth side of said second surface portion, an isolation region formed in said semiconductor chip to separate said first and second surface portions from each other, a first circuit block supplied with a first signal of a first frequency and composed of a plurality of circuit elements formed in said first surface portion, a second circuit block supplied with a second signal of a second frequency different from said first frequency and composed of a plurality of circuit elements formed in said second surface portion, an insulating film covering a surface of said semiconductor chip, a first electrode pad formed on said insulating film and supplied with a power voltage, a first wiring conductor connecting said first electrode pad to said first circuit block and extending along said first side of said first surface portion, a second electrode pad formed on said insulating film and supplied with a ground potential, a second wiring conductor connecting said second electrode pad to said first circuit block and extending along said second side and a part of said third side of said first surface portion, a third electrode pad formed on said insulating film separately from said first electrode pad and supplied with said power voltage, a third wiring conductor connecting said third electrode pad to said second circuit block and extending along said fifth side of said second surface portion in parallel to said second wiring conductor, a fourth electrode pad formed on said insulating film separately from said second electrode pad and supplied with said ground potential, a fourth wiring conductor connecting said fourth electrode pad to said second circuit block and extending along said sixth, seventh and eighth sides of said second surface portion and a part of said thrid wiring conductor, at least one first contact hole formed in said insulating film on said isolation region between said first and second surface portions to connect said second wiring conductor to said isolation region at a portion between said first and second surface portions, and at least one second contact hole formed in said insulating film along a part of said sixth side of said second surface portion to connect said fourth wiring conductor to said isolation region, whereby signal crosstalk between said first and second circuit blocks is prevented by said second and third wiring conductors located between said second side of said first surface portion and said fifth side of said second surface portion.

4. The semiconductor device as claimed in claim 3, further comprising a fifth electrode pad formed on said insulating film and supplied with said ground potential and a fifth wiring conductor connecting said third electrode pad to said first circuit block, said fifth wiring conductor extending in parallel to said first wiring layer and along a part of said fourth side of said first surface portion.

5. A semiconductor device comprising a semiconductor substrate, a first surface area in one portion of said semiconductor substrate, a second surface area in another portion of said semiconductor substrate, an isolation region formed in said semiconductor substrate and isolating said first and second surface areas from each other, a video intermediate frequency amplifier and a signal separator formed in said first surface area, said video intermediate frequency amplifier amplifying a video intermediate frequency signal, said signal separator separating a sound intermediate frequency signal from the amplified video intermediate frequency signal, a sound intermediate frequency amplifier and a sound detector formed in said second surface area, said sound intermediate frequency amplifier amplifying said sound intermediate frequency signal, said sound detector detecting the amplified sound intermediate frequency signal and producing an audio sound signal, a first wiring conductor formed on said semiconductor substrate and supplying a power voltage to said video intermediate frequency amplifier and said signal separator, a second wiring conductor formed on said semiconductor substrate and supplying a reference voltage to said video intermediate frequency amplifier and said signal separator, said second wiring conductor having a portion extending along said isolation region between said first and second surface areas, means for connecting said extended portion of said second wiring conductor to said isolation region between said first and second surface areas, a third wiring conductor formed on said semiconductor substrate separately from said first wiring conductor and supplying said power voltage to said sound intermediate frequency amplifier and said sound detector, said third wiring conductor having a portion extending along said isolation region between said first and second surface areas in parallel to said extended portion of said second wiring conductor, and a fourth wiring conductor formed on said semiconductor substrate separately from said second wiring conductor and supplying said reference voltage to said sound intermediate frequency amplifier and said sound detector, whereby crosstalk between said video and sound intermediate frequency signals and crosstalk between said video intermediate frequency signal and said audio sound signal are prevented by said extended portions of said second and third wiring conductors.

6. The semiconductor device as claimed in claim 5, further comprising a video signal detector formed in said first surface area, a sound signal controller formed in said second surface area, and a fifth wiring conductor formed on said semiconductor substrate separately from said second and fourth wiring conductors and supplying said reference voltage to said video signal detector, said video signal detector detecting said amplified video intermediate frequency signal and producing a picture signal, said sound signal controller controlling a level of said audio sound signal, said video signal detector being supplied with said power voltage through said first wiring conductor, and said sound signal controller being supplied with said power and reference voltages through said third and fourth wiring conductors, respectively.

7. The semiconductor device as claimed in claim 6, further comprising first electrode terminal supplied with said power voltage and connected to said first wiring conductor, a second electrode terminal supplied with said reference voltage and connected to said second wiring conductor, a third electrode terminal supplied with said power voltage and connected to said third wiring conductor, a fourth electrode terminal supplied with said reference voltage and connected to said fourth wiring conductor, and a fifth electrode terminal supplied with said reference voltage and connected to said fifth wiring conductor.

* * * * *